(12) United States Patent
Serizawa et al.

(10) Patent No.: US 7,688,397 B2
(45) Date of Patent: Mar. 30, 2010

(54) DISPLAY UNIT

(75) Inventors: Shinji Serizawa, Tokyo (JP); Takahiro Ikunami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 169 days.

(21) Appl. No.: 11/992,676

(22) PCT Filed: Aug. 14, 2006

(86) PCT No.: PCT/JP2006/316017

§ 371 (c)(1),
(2), (4) Date: Mar. 27, 2008

(87) PCT Pub. No.: WO2007/069370

PCT Pub. Date: Jun. 21, 2007

(65) Prior Publication Data

US 2009/0135328 A1     May 28, 2009

(30) Foreign Application Priority Data

Dec. 12, 2005   (JP) ............................. 2005-358054

(51) Int. Cl.
*G02F 1/1333*   (2006.01)
(52) U.S. Cl. .......................................... 349/58; 349/56

(58) Field of Classification Search .................. None
See application file for complete search history.

(56) References Cited

U.S. PATENT DOCUMENTS

| 6,256,078 | B1 | 7/2001 | Ogata et al. |
| 6,724,317 | B1 | 4/2004 | Kitano et al. |
| 7,236,216 | B2 * | 6/2007 | Oka .......................... 349/58 |
| 2005/0031317 | A1 | 2/2005 | Ikunami |

FOREIGN PATENT DOCUMENTS

| JP | 2-149083 A | 6/1990 |
| JP | 6-3687 A | 1/1994 |
| JP | 2000-159197 A | 6/2000 |
| JP | 2002-204409 A | 7/2002 |
| JP | 2003-323126 A | 11/2003 |
| JP | 2005-57679 A | 3/2005 |
| JP | 2005-280434 A | 10/2005 |
| WO | WO-01/72554 A1 | 10/2001 |

* cited by examiner

*Primary Examiner*—Tina M Wong
(74) *Attorney, Agent, or Firm*—Birch, Stewart, Kolasch & Birch, LLP

(57) ABSTRACT

A display unit includes a display mounting main body 1 secured to a ceiling to which a display is installed; the display 3 openably/closably and rotatably attached to the display mounting main body 1 through a pair of lateral rotating hinge shafts 2; and a circuit board provided as a control system of the display, wherein a wiring-relay circuit board 8 is mounted and disposed on the axis of rotation at the upper part in the extending rotating position of the display 3, and electrically connects a main circuit board disposed in the display mounting main body 1 with an LCD 4 to thereby intermediately connect wirings.

4 Claims, 2 Drawing Sheets

DISPLAY UNIT

TECHNICAL FIELD

The present invention relates to a display unit, for example, suspended from a ceiling of a vehicle.

BACKGROUND ART

A conventional display unit of that type is arranged to include a display mounting main body installed and secured in a parallel state to a ceiling of a vehicle; a display openably/closably and rotatably journaled on the display mounting main body through a pair of lateral rotating hinge shafts; and a circuit board of a system for controlling the display. As described in more detail, the display includes an LCD (liquid crystal display) holder openably/closably and rotatably journaled on the display mounting main body through the pair of lateral rotating hinge shafts; an LCD held by the LCD holder; and the circuit board held by the LCD holder, disposed in parallel in a superposed relation to the back side of the LCD; and further, the display is arranged to be unitized with the LCD and circuit board sandwiched between a rear cover and a frame-shaped front cover. The thus arranged display can be closed into a folding position against the display mounting main body and opened into an extending position out of the folding position, about the pair of lateral rotating hinge shafts (for example, see Patent Document 1).

Patent Document 1: JP-A-6-003687

Since the conventional fastening structure of a circuit board is arranged as mentioned above, a contact area increases between the circuit board and the bottom surface of the concave section that is formed at the board-securing position of the chassis and has a size capable of housing the head of the screw, and therefore, the effective area of the circuit board may be decreased by the contact area. That is, because the circuit board is in close contact with the bottom surface of the concave section formed in the chassis so as to have a bottom of a diameter larger than that of the screw head, a circuit pattern cannot be formed and surface-mounting parts cannot be disposed in the contact area in the circuit board between the board and the bottom surface of the concave section. This may reduce the effective area of the circuit board and cause a drawback to the size reduction of electronic apparatuses.

The present invention has been made to solve the above-mentioned problems, and an object of the present invention is to provide a display unit where notwithstanding a display including a circuit board, simply changing the location where the circuit board for the display is disposed enables the thickness reduction of the whole display, and can reduce the force needed for opening or closing the display and the swing of the display caused by the vibration.

DISCLOSURE OF THE INVENTION

The display unit according to the present invention includes a display mounting main body mounted to a ceiling as an object to which a display is attached; a display openably/closably and rotatably attached to the display mounting main body through a pair of lateral rotating hinge shafts; and a circuit board of a system for controlling the display, wherein a wiring-relay circuit board is mounted and disposed on the axis of rotation of the rotating hinge shafts, and electrically connects a main circuit board disposed in the display mounting main body with an LCD to thereby intermediately connect wirings.

According to the present invention, since the wiring-relay circuit board for relaying the wirings connecting the main circuit board with the LCD is arranged to be mounted and disposed on the axis of rotation of the rotating hinge shafts, a display structure where the LCD and the circuit board are placed in a unsuperposed manner with each other in the thickness direction of the display can be obtained, thus enabling the achievement of thickness reduction of the display. Further, as described above, the wiring-relay circuit board is mounted and disposed on the axis of rotation of the rotating hinge shafts, which can make the position of the center of gravity of the display nearer to the location between the lateral rotating hinge shafts to reduce the rotational moment caused by the self-weight of the display. This can reduce the force needed for opening or closing the display to improve the ease of opening or closing the display, and further reduce the swing of the display caused by the vibration.

BEST MODE FOR CARRYING OUT THE INVENTION

Embodiments of the present invention will now be described with reference to the accompanying drawings in order to explain the present invention in more detail.

First Embodiment

Figure 1:
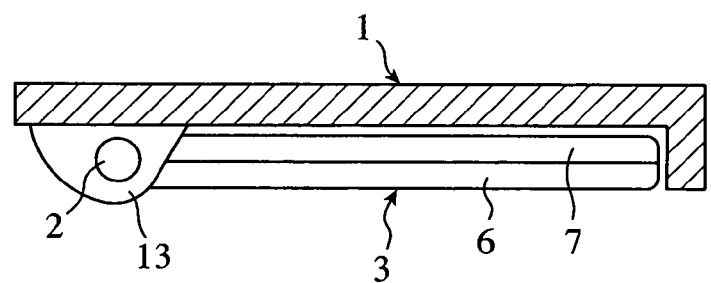
FIG. 1 is a side view showing an on-vehicle display unit according to the first embodiment of the present invention.
Figure 2:
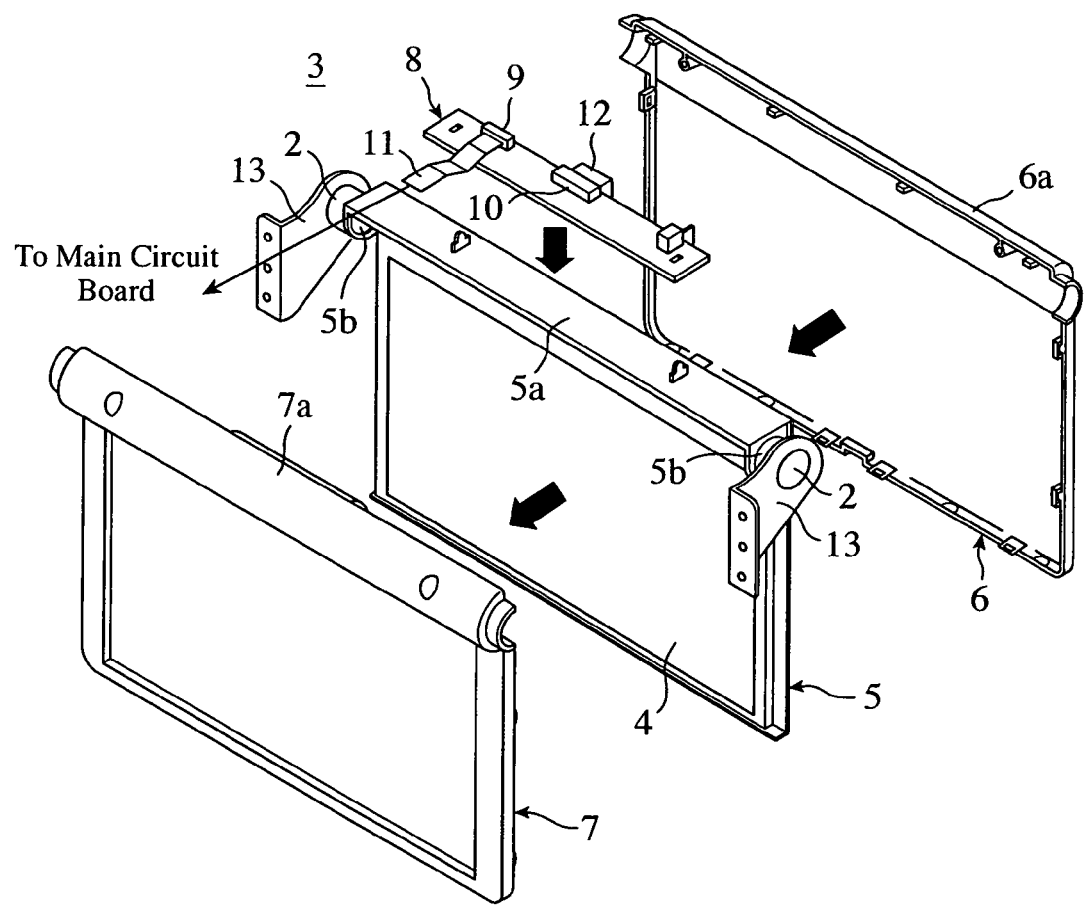
FIG. 2 is an exploded perspective view of a display removed by the display mounting main body of FIG. 1.

FIG. 1 is a side view showing an on-vehicle display unit according to the first embodiment of the present invention. FIG. 2 is an exploded perspective view of a display as removed by a display mounting main body of FIG. 1.

The display unit as shown in FIG. 1 is arranged to include a display mounting main body 1 mounted and fastened parallel to a ceiling of a vehicle to which a display is installed; a display 3 openably/closably and rotatably journaled on the display mounting main body 1 through a pair of lateral rotating hinge shafts 2; and a wiring-relay circuit board 8 that is mounted and disposed on the axis of rotation at the upper part in the extending use position of the display 3, and electrically connects a main circuit board (not shown) disposed in the display mounting main body 1 with an LCD 4 of the display 3 (see FIG. 2) to intermediately connect or relay wirings.

In further detail, as shown in FIG. 2, the display 3 includes the LCD 4; a LCD holder 5 of a frame shape having a rectangular front face, which holds the LCD 4; a rear cover 6 covering all the back side of the LCD 4 containing the LCD holder 5; and a rectangular frame-shaped front cover 7 covering the front side of the LCD holder 5, with the wiring-relay circuit board 8 mounted and disposed on the axis of rotation positioned in the top face area of the LCD holder 5. Here, the upper end of the LCD holder 5 is integrally formed with a horizontal plane plate 5a at the overall length in the longitudinal direction, and the back side of the wiring-relay circuit board 8 is superposed parallel on the horizontal plane plate 5a, thus mounting and disposing the wiring-relay circuit board 8 on the horizontal plane plate 5a in a state of flat placement.

The wiring-relay circuit board 8 thus mounted and disposed on the horizontal plane plate 5a located on the upper end of the LCD holder 5 is formed lengthwise of the horizontal plane plate 5a in a transversely extending rectangular shape which has a size not to protrude from the area of the horizontal plane plate 5a, and then connectors 9, 10 for wiring connection, electrically connected to each other, are mounted on the surface of the wiring-relay circuit board 8. On those connectors 9, 10, it is arranged that the one connector 9 and the main circuit board disposed in the display mounting main body 1 be connected to each other with a flexible wiring board (flexible printed wiring) 11 and that the other connector 10 and the LCD 4 be connected to each other with a flexible wiring board 12, respectively. Moreover, flanges 5b bent in the same direction are formed at both ends of the horizontal plane plate 5a in its lengthwise direction, and the pair of lateral rotating hinge shafts 2 are provided from the flanges 5b in an outwardly protruding condition. Those rotating hinge shafts 2 are rotatably journaled by hinge brackets 13 secured to the underside of the display mounting main body 1.

The respective upper ends of the rear cover 6 and the front cover 7 are formed with curved covers 6a, 7a symmetrical in the arcuate section lengthwise extending the entire length of the respective covers, and those curved covers 6a, 7a are arranged to cover the horizontal plane plate 5a located on the upper end of the LCD holder 5 and the wiring-relay circuit boards 8 positioned on the horizontal plane plate 5a.

According to the above-described first embodiment, it is arranged such that the main circuit board is disposed in the display mounting main body 1 mounted parallel to a ceiling of a vehicle or the like to which the display is attached, and the wiring-relay circuit board 8 electrically connecting the main circuit board with the LCD 4 of the display 3 to thereby intermediately connect the wirings for controlling the LCD 4 is mounted and disposed, in a state of flat placement, on the horizontal plane plate 5a formed on the axis of rotation at the upper part of the LCD holder 5. Therefore, the whole thickness of the display 3 can be just the thickness where the LCD holder 5 and the rear cover 6 and front cover 7 having sandwiched therebetween the LCD holder 5 are assembled to each other. For this reason, the thickness reduction of the display 3 can be achieved in comparison with the structure of the conventional display where a circuit board is interposed between the back side of the LCD 4 and the rear cover 6.

Furthermore, as mentioned above, the wiring-relay circuit board 8 may be a small one, mounted and disposed on the horizontal plane plate 5a positioned on the axis of rotation at the upper end of the LCD holder 5, and besides the wiring-relay circuit board 8 is held between the lateral rotating hinge shafts 2, which can shift the position of the center of gravity of the display 3 nearer to the location between the rotating hinge shafts 2 than the case of the structure of the conventional display. In such a way, the rotational moment of the display 3 is reduced, which may reduce the force required to open or close the display 3 and reduce the swing of the display 3 caused by the vibration and so on at a vehicle driving time. Further, the display unit can be given an enhanced design appearance, and the wiring-relay circuit board 8 can be protected because the curved covers 6a, 7a formed lengthwise of the respective upper ends of the rear cover 6 and the front cover 7 cover the horizontal plane plate 5a and the wiring-relay circuit board 8 that are positioned at the upper end of the LCD holder 5.

Second Embodiment

Figure 3:
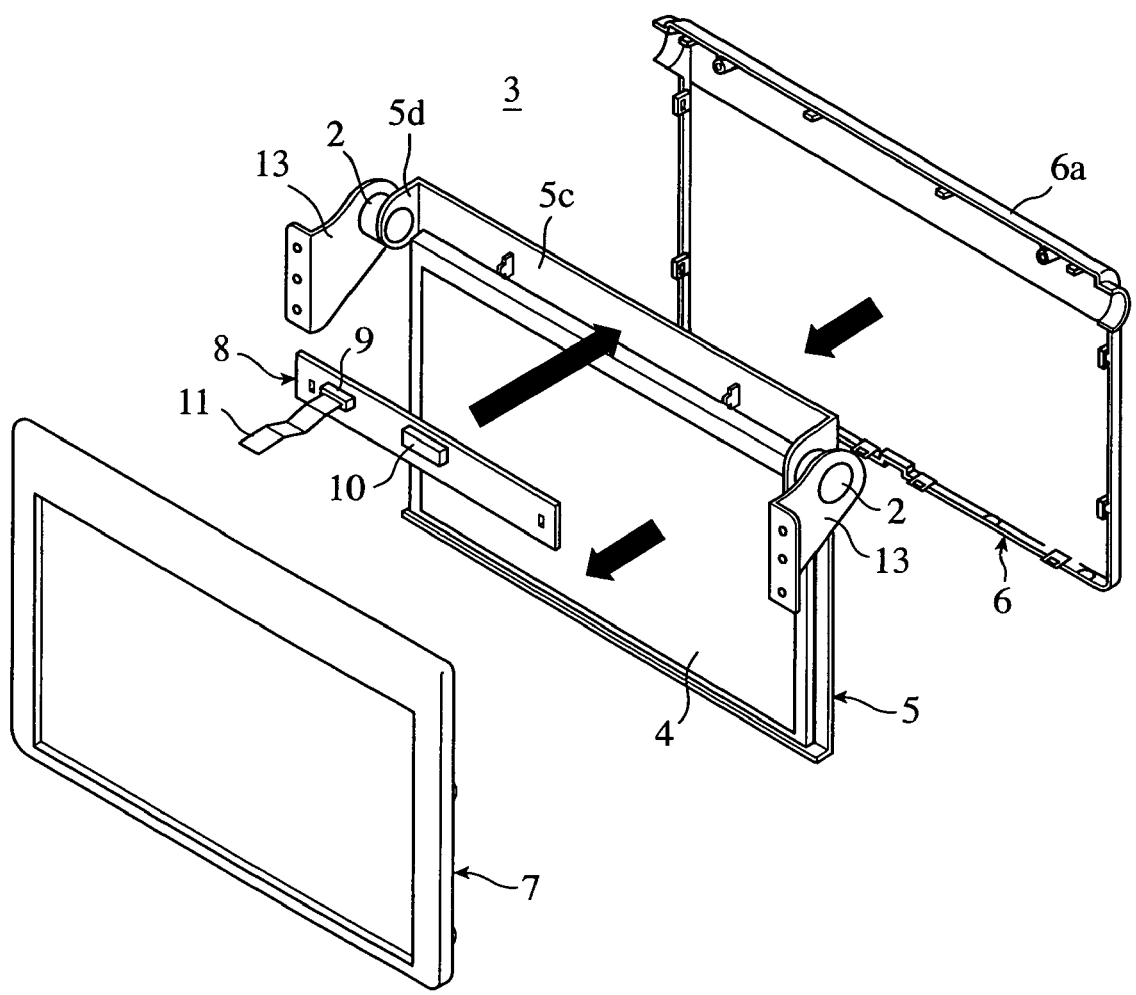
FIG. 3 is an exploded perspective view of a display as removed by the display mounting main body of an on-vehicle display unit according to the second embodiment of the present invention.

FIG. 3 is an exploded perspective view of the display of an on-vehicle display unit as removed by a display mounting main body according to the second embodiment of the present invention. The same parts as those in FIG. 2 are designated by similar reference numerals, and the repetitive explanation is omitted.

In the above-described first embodiment, the horizontal plane plate 5a having a width corresponding to the width of the wiring-relay circuit board 8 is formed in a longitudinal direction on the axis of rotation at the upper end of the LCD holder 5, and the wiring-relay circuit board 8 is mounted and disposed on the horizontal plane plate 5a in a state of flat placement. However, in the second embodiment, the wiring-relay circuit board 8 is mounted and disposed on the axis of rotation in a state of vertical placement where the circuit board is widthwise raised at the upper portion of the LCD holder 5. According to the second embodiment, it is arranged such that the upper end of the LCD holder 5 is lengthwise integrally formed with a vertical plane plate 5c, and the wiring-relay circuit board 8 is held in a manner widthways raised along the vertical plane plate 5c between lateral rotating hinge shafts 2, which are protrudingly provided on flanges 5d formed in a bending way at the both ends in the longitudinal direction of the vertical plane plate 5c.

According to the above-described second embodiment, since the wiring-relay circuit board 8 is arranged to be held raised into a state of vertical placement between the lateral rotating hinge shafts 2 on the axis of rotation in the upper end face area of the LCD holder 5, the width required to install the wiring-relay circuit board 8 on the upper end face of the LCD holder 5 can be reduced, and the wiring-relay circuit board 8 can be mounted and disposed on the axis of rotation within the width in the upper end face of the LCD holder 5. This can eliminate the need for forming the curved cover 7a at the upper end of the front cover 7 as the case of the first embodiment, and the entire front cover 7 can be shaped as a substantially flush frame. Therefore, the thickness reduction of the portion between the rotating hinge shafts 2 of the display 3 can be achieved as compared with the case of the first embodiment, and the protrusion like the curved cover 7a therein does not need to be formed on the front face of the front cover 7 to thus permit of a simple design appearance of the display.

INDUSTRIAL APPLICABILITY

As mentioned above, the present invention is suitable to obtain a thin-shaped display unit to be installed on the ceiling of vehicles or the like such that the swing of a display due to vibration and so on can be reduced.

The invention claimed is:

1. A display unit comprising:
    a display mounting main body mounted to a ceiling as an object to be installed;
    a display openably/closably and rotatably attached to the display mounting main body through a pair of lateral rotating hinge shafts; and
    a circuit board for controlling the display,
    wherein a wiring-relay circuit board is mounted and disposed on the axis of rotation at the upper part in an extending-use position of the display, and electrically connects a main circuit board disposed in the display mounting main body with an LCD to thereby intermediately connect wirings.

2. The display unit according to claim 1, wherein the display includes:
- an LCD holder openably/closably and rotatably journaled on the display mounting main body through the pair of lateral rotating hinge shafts;
- the LCD held by the LCD holder;
- a rear cover covering the back side of the LCD and the LCD holder; and
- a frame-shaped front cover covering the front side of the LCD holder,
- wherein the wiring-relay circuit board is mounted and disposed on the axis of rotation of the rotating hinge shafts.

3. The display unit according to claim 2, wherein the wiring-relay circuit board is mounted and disposed in a state of flat placement where the back side of the circuit board is superposed in parallel on the axis of rotation of the rotating hinge shafts.

4. The display unit according to claim 1, wherein the wiring-relay circuit board is mounted and disposed in a state of vertical placement where the circuit board is widthwise raised on the upper portion of the LCD holder.

* * * * *